United States Patent [19]
Knuijt

[11] Patent Number: 5,620,300
[45] Date of Patent: Apr. 15, 1997

[54] METHOD OF CONSTRUCTING A TURBINE NOZZLE TO PREVENT STRUCTURALLY INDUCED EXCITATION FORCES

[75] Inventor: Hans M. Knuijt, Niskayuna, N.Y.

[73] Assignee: General Electric Co., Schenectady, N.Y.

[21] Appl. No.: 559,055

[22] Filed: Nov. 16, 1995

[51] Int. Cl.$^6$ .................................................. F01D 25/04
[52] U.S. Cl. ...................................... 415/19.6; 29/889.22
[58] Field of Search ........................ 415/119; 29/889.22; 60/725

[56] References Cited

U.S. PATENT DOCUMENTS 3,194,487  7/1965  Tyler et al. .............................. 415/119

Primary Examiner—James Larson
Attorney, Agent, or Firm—Nixon & Vanderhye

[57] ABSTRACT

A method of constructing a turbine nozzle with a plurality of nozzle segments minimizes structurally induced excitation forces. The method includes inputting structural characteristics of each of the plurality of nozzle segments, theoretically selecting a random sequencing of the plurality of nozzle segments, calculating a relative harmonic content of per revolution excitation forces of the sequence in accordance with the structural characteristics, theoretically exchanging nozzle segments in pairs to change the sequence of the plurality of nozzle segments, testing the new sequences repeatedly until all possible sequences have been tested, and selecting a sequence that best prevents structurally induced excitation forces. In an alternative embodiment of the invention, the harmonic distortion caused by structural features of a particular unit design is considered as well as the swirl effect that occurs as the gas translates through the turbine. After the best sequence is determined, the nozzle segments can then be placed into the structural casing.

11 Claims, 3 Drawing Sheets

METHOD OF CONSTRUCTING A TURBINE NOZZLE TO PREVENT STRUCTURALLY INDUCED EXCITATION FORCES

FIELD OF THE INVENTION

The present invention relates to a method of constructing a turbine nozzle and, more particularly, to a method of constructing a turbine nozzle with a plurality of nozzle segments to prevent structurally induced excitation forces.

BACKGROUND

Turbine buckets are subjected to a gas force that provides torque to the rotor. Relatively small variations in these gas forces such as, for example, upstream nozzle throat area induced harmonic distortion of the hot gas airflow, can cause bucket vibration. Coincidence of resonance between these nozzle-induced periodic gas forces and bucket natural frequencies must be avoided at full operating speed; however, resonance cannot be avoided at all speeds, particularly during starting and shutdown. Effective vibration control is required, therefore, to produce reliable turbine designs.

The development of turbine stages that are vibration free requires sophisticated interaction between the aerodynamic design and testing disciplines. For free-standing buckets, the calculation of frequencies is relatively routine; however, the amplitude of vibration response of buckets to aerodynamic stimulus is not easily determined without extensive test correlations. When the complexities of variable boundary conditions at platform and tip shroud are introduced into the assembly, analytical predictions become even more uncertain. Extensive test experience is required, therefore, to produce a reliable design.

Currently, time consuming and error prone nozzle throat area hand measurements are taken after the nozzles are assembled into the structural support casing. These measurements are then hand typed into a computer that is programmed to calculate the relative harmonic contents of the per revolution excitation forces by fourier series analysis techniques. If the preestablished criterion are not met, the nozzles are removed and other sequences are tried until the criterion are met. Nozzle throat area checks are made at every turbine stage to ensure that the amount of periodic excitation forces caused by variations in the circumferential spacing and manufactured shape of the nozzle segments does not exceed maximum values. Also, periodic placement of upstream structural components induces circumferential varying gas forces. The buckets, which follow the nozzles in the gas path, are subject to these periodic gas force pulses as they pass by the nozzles, which could excite one of their natural frequencies of vibration, causing ultimate catastrophic failure of the unit.

DISCLOSURE

It is therefore an object of the invention to provide a method of constructing a turbine nozzle that eliminates the time consuming and error prone hand measurements and minimizes structurally induced excitation forces. It is another object of the invention to provide a method of constructing a turbine system to prevent structurally induced excitation forces.

These and other objects and advantages are achieved by providing a method of constructing a turbine nozzle with a plurality of nozzle segments to prevent structurally induced excitation forces. The method includes (a) inputting structural characteristics of each of the plurality of nozzle segments; (b) theoretically selecting a random sequencing of the plurality of nozzle segments; (c) calculating a relative harmonic content of per revolution excitation forces of the sequence in accordance with the structural characteristics; (d) theoretically exchanging nozzle segments in pairs to change the sequence of the plurality of nozzle, segments; (e) repeating steps (c) and (d) until all possible sequences have been tested; and (f) selecting a sequence that best prevents structurally induced excitation forces.

The structural characteristics may include nozzle throat areas, and the calculating step may include calculating the relative harmonic content in accordance with the nozzle throat areas.

The calculating step may further include calculating the relative harmonic content in accordance with distances between the nozzle segments.

Prior to the selecting step, the method may include prioritizing harmonics, preferably three, to minimize. In this regard, the selecting step may include selecting a sequence that best prevents structurally induced excitation forces in accordance with the prioritized harmonics.

In accordance with another aspect of the invention, there is provided a method of constructing a turbine system to prevent structurally induced excitation forces. The method includes (a) inputting system geometry; (b) inputting nozzle geometry of a plurality of nozzle segments; (c) inputting whether to minimize nozzle arrangement harmonics or whole system harmonics; (d) if minimizing nozzle arrangement harmonics, moving to step (f); (e) calculating turbine swirl and system caused harmonics; (f) theoretically selecting a random sequencing of the plurality of nozzle segments; (g) calculating a relative harmonic content of per revolution excitation forces of the sequence in accordance with the system geometry and the nozzle geometry, and if minimizing whole system harmonics, also in accordance with the system caused harmonics; (h) theoretically exchanging nozzle segments in pairs to change the sequence of the plurality of nozzle segments; (i) repeating steps (g) and (h) until all possible sequences have been tested; and (j) selecting a sequence that best prevents structurally induced excitation forces.

The system geometry may include a number of airfoils and a number of combustion cans, and the nozzle geometry may include nozzle throat areas and a distance between nozzle segments. In this regard, the calculating step may include calculating the relative harmonic content in accordance with the number of airfoils, the number of combustion cans, the distance between nozzle segments, and the nozzle throat areas.

Prior to the selecting step, the method may include prioritizing harmonics, preferably three, to minimize. In this regard, the selecting step may include selecting a sequence that best prevents structurally induced excitation forces in accordance with the prioritized harmonics.

BRIEF DESCRIPTION OF THE DRAWINGS

These and other aspects and advantages of the present invention will become apparent from the followed detailed description of preferred embodiments when taken in conjunction with the accompanying drawings, in which.

BEST MODE FOR CARRYING OUT THE INVENTION

Figure 1:
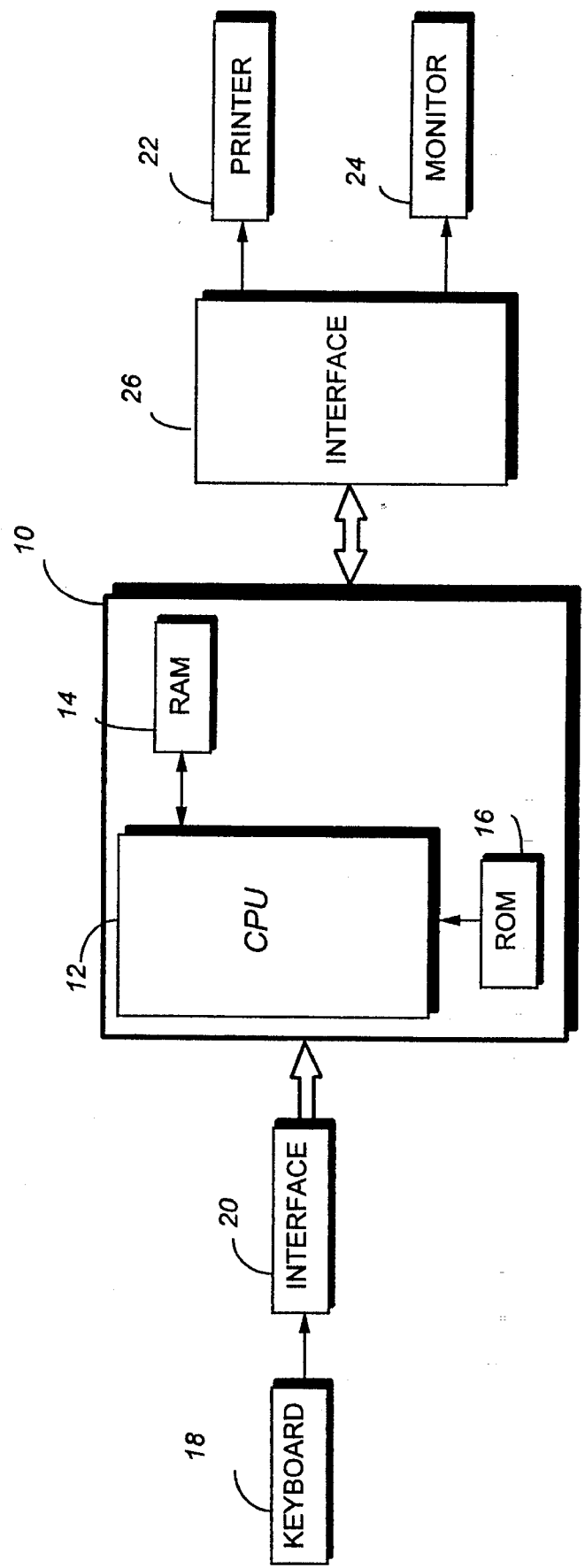
FIG. 1 is a block diagram of the structure according to the invention.

FIG. 1 is a block diagram of the structure that carries out the method of the present invention. FIG. 1 generally depicts a special purpose computer that is programmed to carry out the method of the invention. In particular, a controller 10 includes a CPU 12 communicating with a RAM 14 and a ROM 16. A keyboard 18 communicates with the controller 10 via an interface 20, and the controller 10 communicates with a printer 22, monitor 24 or the like via a second interface 26. Those of ordinary skill in the art will contemplate alternatives for the structure to carry out the method of the invention, and the invention is not meant to be limited to the structure illustrated and described.

Figure 2A:
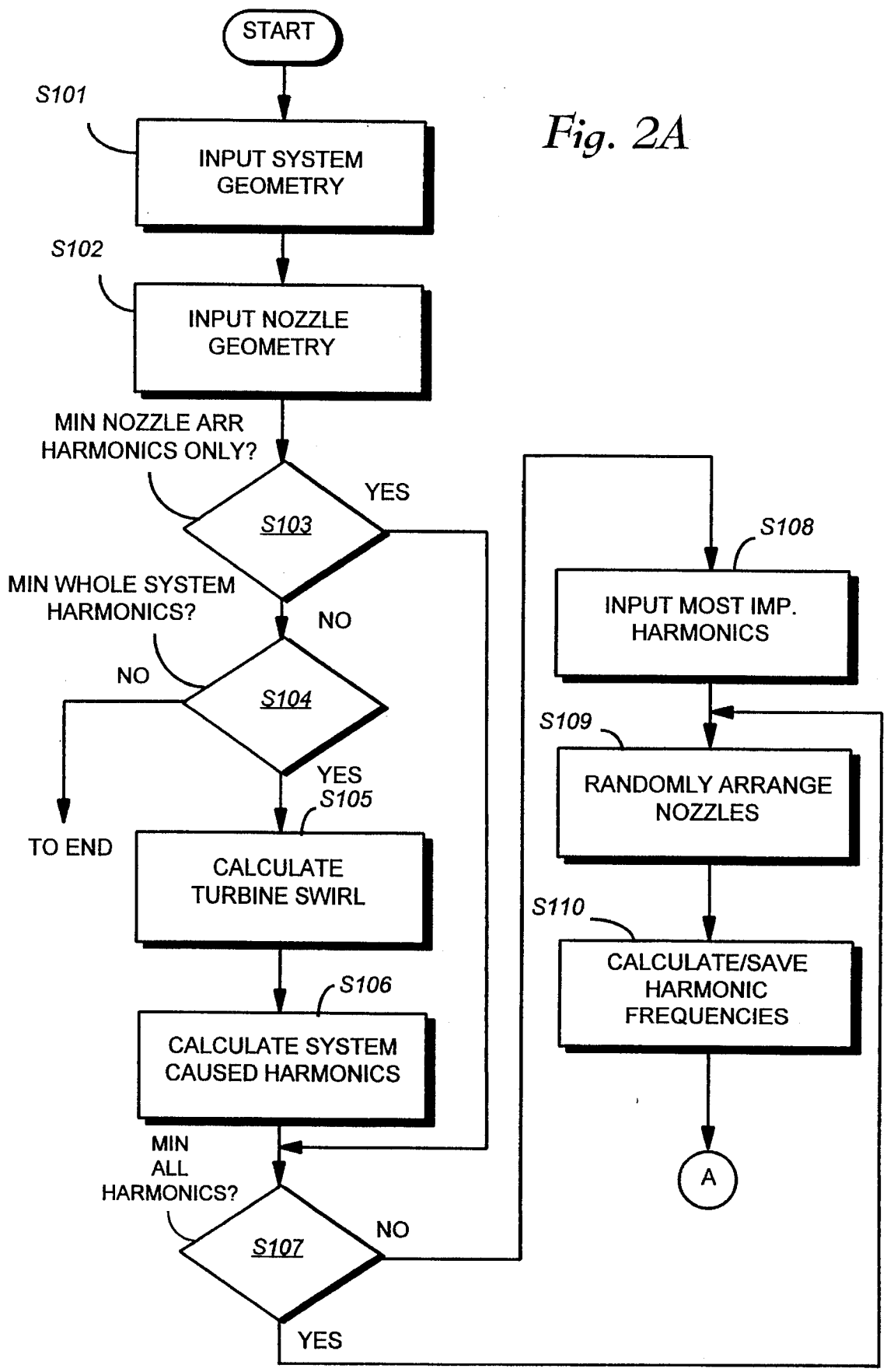
FIGS. 2A and 2B are a flowchart, illustrating the method of the invention.
Figure 2B:
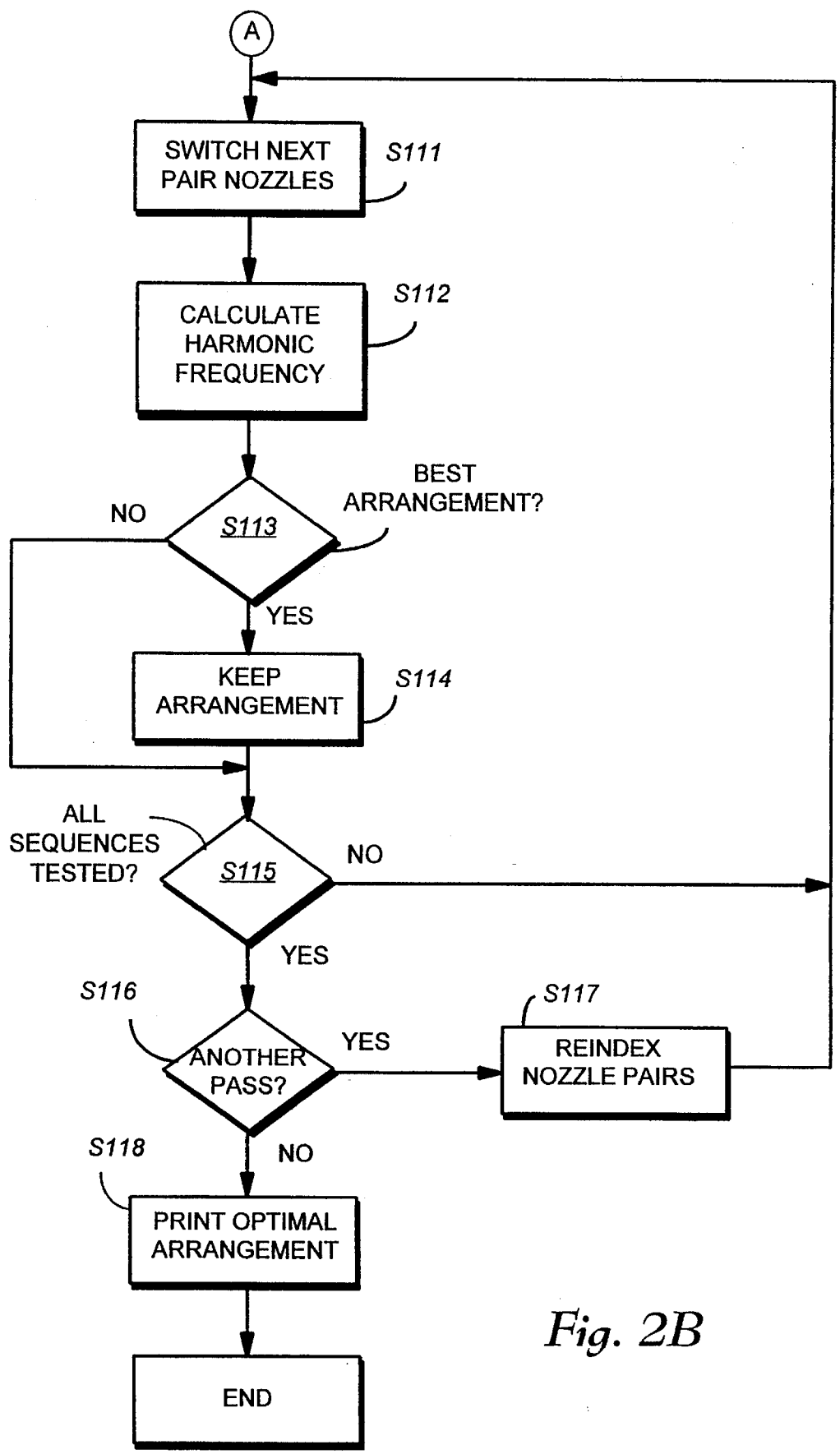

The method of the invention produces the configuration of a turbine nozzle or turbine system that minimizes structurally induced excitation forces in accordance with the characteristics of the nozzle segments that make up the nozzle as well as the structure of the system. FIGS. 2A and 2B illustrate the method of the invention. In step S101, system geometry is inputted into the memory. The system geometry includes the number of airfoils in the system and the number of combustion cans in the system. Each turbine stage includes a nozzle that is formed of a plurality of nozzle segments. Each nozzle segment is held in place by a locating feature on the segment, a locating feature on the structural support casing, and a part that connects the two locating features. The circumferential position of the locating features in the structural casing, and the throat areas, relative to the locating feature of the nozzle, are measured automatically by known digitally controlled machines at the manufacturing site as a natural extension of the quality assurance process. Thus, also included in the system geometry is the spacing between the nozzle segments.

In step S102, geometric characteristics of the nozzle segments are input. In a preferred embodiment, each nozzle segment includes two airfoils and a single throat area therebetween. During manufacture of these nozzle segments, the throat areas fall within predetermined tolerances. The actual throat areas are included in the harmonic calculation and are inputted in step S102. The downstream bucket natural frequencies are known and are also input.

In step S103, it is determined whether the operator intends to minimize harmonics for a single nozzle arrangement or for the whole system (step S104). In this regard, the method of the invention enables the operator to selectively determine whether to minimize the harmonics for a single nozzle or to perform the analysis on a whole turbine system. In the analysis of the whole system, the harmonic distortion caused by structural features of a particular unit design is considered as well as the swirl effect that occurs as the gas translates through the turbine. That is, a combustor can-to-can temperature profile variation and a circumferential combustor can-to-can temperature profile variation, determined in a known manner, are inputted to calculate system harmonics caused by swirl.

If the operator intends to minimize only the nozzle arrangement harmonics (yes in step S103), the controller operation moves to step S107. In step S105, the turbine swirl is calculated using a known process, and in step S106, system caused harmonics are determined also using a known process.

The method of the invention also enables the operator to input important harmonics to minimize. That is, if it is more important to minimize specific harmonics that are particularly damaging to the system (e,g., 1 per rev, 4 per rev) or if it is determined that a bucket is particularly sensitive to a specific harmonic, the operator can input the most important harmonics to minimize in steps S107 and S108. In a preferred embodiment, the method enables the operator to minimize or completely prevent the occurrence of the three most important harmonics.

An initially random sequencing of the nozzle segments is assumed (step S109), and the relative harmonic content of the per revolution excitation forces within a specified range is calculated by the fourier series analysis technique (step S110). In step S111, the nozzle segments are then theoretically swapped by the controller one pair at a time, and the excitation forces of the new sequence are calculated (step S112). The relative excitation forces of the new sequence are compared with the relative excitation forces of the latest best sequence in step S113, to see which ordering best avoids exciting the bucket natural frequencies, which have been previously input into the system. If the sequence is better than the latest best sequence, the new sequence becomes the latest best sequence (step S114).

In step S115, it is determined whether all sequences of nozzle segments have been tested. If not (no in step S115), the controller returns the operation to step S111. If all sequences have been tested (yes in step S115), the operator is given the option to perform another pass, starting with the latest best sequence. In the event that the operator desires another pass (yes in step S116), the nozzle pairs are reindexed (step S117), and the controller returns the operation to step S111. If the operator does not desire another pass (no in step S116), the optimal sequence of nozzle segments is printed out or displayed in step S118.

Once the operator has determined the optimal sequence of nozzle segments, the nozzle segments can then be placed into the structural casing in this best sequence.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of constructing a turbine nozzle with a plurality of nozzle segments to prevent structurally induced excitation forces, the method comprising:

(a) inputting structural characteristics of each of said plurality of nozzle segments;

(b) theoretically selecting a random sequencing of said plurality of nozzle segments;

(c) calculating a relative harmonic content of per revolution excitation forces of the sequence in accordance with said structural characteristics;

(d) theoretically exchanging nozzle segments in pairs to change the sequence of said plurality of nozzle segments;

(e) repeating steps (c) and (d) until all possible sequences have been tested; and (f) selecting a sequence that best prevents structurally induced excitation forces.

2. A method according to claim 1, wherein said structural characteristics comprise nozzle throat areas, said calculating step comprising calculating said relative harmonic content in accordance with said nozzle throat areas.

3. A method according to claim 1, wherein said calculating step comprises calculating said relative harmonic content in accordance with distances between said nozzle segments.

4. A method according to claim 1, further comprising, prior to said selecting step, prioritizing harmonics to minimize.

5. A method according to claim 4, wherein said prioritizing step comprises prioritizing three harmonics to minimize.

6. A method according to claim 4, wherein said selecting step comprises selecting a sequence that best prevents structurally induced excitation forces in accordance with said prioritized harmonics.

7. A method of constructing a turbine system to prevent structurally induced excitation forces, the method comprising:

(a) inputting system geometry;

(b) inputting nozzle geometry of a plurality of nozzle segments;

(c) inputting whether to minimize nozzle arrangement harmonics or whole system harmonics;

(d) if minimizing nozzle arrangement harmonics, moving to step (f);

(e) calculating turbine swirl and system caused harmonics;

(f) theoretically selecting a random sequencing of said plurality of nozzle segments;

(g) calculating a relative harmonic content of per revolution excitation forces of the sequence within a predetermined range in accordance with said system geometry and said nozzle geometry, and if minimizing whole system harmonics, also in accordance with said system caused harmonics;

(h) theoretically exchanging nozzle segments in pairs to change the sequence of said plurality of nozzle segments;

(i) repeating steps (g) and (h) until all possible sequences have been tested; and (j) selecting a sequence that best prevents structurally induced excitation forces.

8. A method according to claim 7, wherein said system geometry comprises a number of airfoils and a number of combustion cans, and wherein said nozzle geometry comprises nozzle throat areas and a distance between nozzle segments, said calculating step comprising calculating said relative harmonic content in accordance with said number of airfoils, said number of combustion cans, said distance between nozzle segments, and said nozzle throat areas.

9. A method according to claim 7, further comprising, prior to said selecting step, prioritizing harmonics to minimize.

10. A method according to claim 9, wherein said prioritizing step comprises prioritizing three harmonics to minimize.

11. A method according to claim 9, wherein said selecting step comprises selecting a sequence that best prevents structurally induced excitation forces in accordance with said prioritized harmonics.

* * * * *